US009236335B2

(12) United States Patent
Ishikawa

(10) Patent No.: US 9,236,335 B2
(45) Date of Patent: Jan. 12, 2016

(54) SEMICONDUCTOR DEVICE INCLUDING STACKED SEMICONDUCTOR CHIPS WITHOUT OCCURRING OF CRACK

(71) Applicant: PS4 Luxco S.a.r.l., Luxembourg (LU)

(72) Inventor: Toru Ishikawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 253 days.

(21) Appl. No.: 13/706,752

(22) Filed: Dec. 6, 2012

(65) Prior Publication Data

US 2013/0147038 A1 Jun. 13, 2013

(30) Foreign Application Priority Data

Dec. 7, 2011 (JP) .................................. 2011-267988

(51) Int. Cl.
| H01L 23/498 | (2006.01) |
| H01L 23/31 | (2006.01) |
| H01L 23/48 | (2006.01) |
| H01L 25/065 | (2006.01) |
| H01L 23/00 | (2006.01) |
| H01L 25/18 | (2006.01) |

(52) U.S. Cl.
CPC ...... *H01L 23/49811* (2013.01); *H01L 23/3128* (2013.01); *H01L 23/481* (2013.01); *H01L 23/562* (2013.01); *H01L 25/0657* (2013.01); *H01L 25/18* (2013.01); *H01L 2224/16145* (2013.01); *H01L 2225/06513* (2013.01); *H01L 2225/06517* (2013.01); *H01L 2225/06544* (2013.01); *H01L 2225/06555* (2013.01)

(58) Field of Classification Search
CPC ..................... H01L 23/49811; H01L 23/3128; H01L 23/481; H01L 25/0657; H01L 2225/06555; H01L 35/18; H01L 2225/06517; H01L 2224/16145; H01L 2225/06544; H01L 2225/06513; H01L 23/498
USPC ......... 257/686, 685, 777, 737, 738, 778, 723, 257/724, 728, 779, 780
See application file for complete search history.

(56) References Cited

U.S. PATENT DOCUMENTS

| 5,790,384 | A  * | 8/1998  | Ahmad et al. ................. 361/760 |
| 6,271,059 | B1 * | 8/2001  | Bertin et al. .................. 438/109 |
| 6,489,669 | B2 * | 12/2002 | Shimada et al. .............. 257/686 |
| 2001/0002727 | A1 * | 6/2001  | Shiraishi et al. .............. 257/685 |
| 2004/0124539 | A1 * | 7/2004  | Yang et al. .................... 257/777 |
| 2005/0104183 | A1 * | 5/2005  | Kuroda et al. ................ 257/686 |
| 2005/0236684 | A1 * | 10/2005 | Chen et al. .................... 257/433 |

(Continued)

FOREIGN PATENT DOCUMENTS

JP          2010-161102 A      7/2010

*Primary Examiner* — Alexander Oscar Williams

(57) ABSTRACT

A device includes first and second semiconductor chips. The first semiconductor chip includes an edge defining a periphery of the first semiconductor chip. The second semiconductor chip is greater in size than the first semiconductor chip. The second semiconductor chip is stacked over the first semiconductor chip so that the second semiconductor chip hangs over from the edge of the first semiconductor chip. The second semiconductor chip includes a plurality of wiring patterns including a first wiring pattern that positions over the edge of the first semiconductor chip, an insulating film which covers the wiring patterns and which includes on or more holes that expose one or more the wiring patterns, and one or more bump electrodes formed on the one or more the wiring patterns. Remaining one or ones of the wiring patterns is kept covered by the insulating layer and includes the first wiring pattern.

20 Claims, 12 Drawing Sheets

(56) References Cited

U.S. PATENT DOCUMENTS

| | | | |
|---|---|---|---|
| 2008/0251913 A1* | 10/2008 | Inomata | 257/737 |
| 2009/0032926 A1* | 2/2009 | Sharifi | 257/686 |
| 2010/0171208 A1 | 7/2010 | Fujii | |
| 2011/0042820 A1* | 2/2011 | Knickerbocker | 257/774 |
| 2011/0089553 A1* | 4/2011 | Kim et al. | 257/686 |
| 2012/0061827 A1* | 3/2012 | Fujita | 257/737 |
| 2012/0211885 A1* | 8/2012 | Choi et al. | 257/737 |
| 2012/0220079 A1* | 8/2012 | Fujii | 438/107 |
| 2012/0248600 A1* | 10/2012 | Shigezane et al. | 257/737 |
| 2012/0261662 A1* | 10/2012 | Liang et al. | 257/48 |
| 2013/0162282 A1* | 6/2013 | Hatakeyama et al. | 324/762.01 |
| 2013/0313689 A1* | 11/2013 | Torii et al. | 257/621 |
| 2013/0313690 A1* | 11/2013 | Miyazaki | 257/621 |
| 2014/0001639 A1* | 1/2014 | Hiraishi et al. | 257/773 |
| 2014/0138848 A1* | 5/2014 | Matsuura | 257/774 |
| 2014/0210497 A1* | 7/2014 | Endo | 324/750.3 |

* cited by examiner

SEMICONDUCTOR DEVICE INCLUDING STACKED SEMICONDUCTOR CHIPS WITHOUT OCCURRING OF CRACK

This application is based upon and claims the benefit of priority from Japanese patent application No. 2011-267988, filed on Dec. 7, 2011, the disclosure of which is incorporated herein in its entirety by reference.

BACKGROUND OF THE INVENTION

1. Field of the Invention

This invention relates to a semiconductor device.

2. Description of Related Art

In recent years, with miniaturization of electronic equipment embedding semiconductor devices or the like, demand for fining of the semiconductor devices has been intensifying. Therefore, development of the semiconductor devices advances in which a plurality of semiconductor chips are stacked over and the plurality of semiconductor chips are connected via penetration electrodes.

In general, in the semiconductor device in which the plurality of semiconductor chips are stacked over, in order to prevent bumps for connecting the semiconductor chips from rupturing resulting from a warp of the semiconductor chip, dummy bumps or reinforcing bumps (which will later be called "dummy bumps" also including the reinforcing bumps) are formed on each semiconductor chip (see, JP-A 2010-161102 which will be called Patent Document 1 and which corresponds to US 2010/0171208 A1).

However, in a case where semiconductor chips having different sizes such as a logic chip and a memory chip of Patent Document 1 are stacked over, dummy bumps formed on one semiconductor chip may be positioned to edges (edge portions) of another semiconductor chip and it is feared that crack occurs in the edge portions of the other semiconductor chip in the manner which will later be described in conjunction with FIGS. 9A and 9B.

SUMMARY

In one aspect of the present invention, there is provided a device that includes first and second semiconductor chips. The first semiconductor chip includes an edge defining a periphery of the first semiconductor chip. The second semiconductor chip is greater in size than the first semiconductor chip. The second semiconductor chip is stacked over the first semiconductor chip so that the second semiconductor chip hangs over from the edge of the first semiconductor chip. The second semiconductor chip includes a plurality of upper layer wiring patterns, a first insulating film, and one or more main surface bump electrodes. The plurality of upper layer wiring patterns includes a first wiring pattern that positions over the edge of the first semiconductor chip. The first insulating film covers the upper layer wiring patterns. The first insulating film includes one or more holes that expose one or more the upper layer wiring patterns. The one or more main surface bump electrodes are formed on the one or more the upper layer wiring patterns. Remaining one or ones of the upper layer wiring patterns are kept covered by the first insulating layer. The remaining one or ones of the upper layer wiring patterns include the first wiring pattern.

In another aspect of the present invention, there is provided a device that includes first and second semiconductor chips. The first semiconductor chip includes an edge defining a periphery of the first semiconductor chip. The second semiconductor chip is greater in size than the first semiconductor chip. The second semiconductor chip is stacked over the first semiconductor chip so that the second semiconductor chip hangs over from the edge of the first semiconductor chip. The second semiconductor chip includes a plurality of upper layer wiring patterns, one ore more main surface bump electrodes. The upper layer wiring patterns include a first wiring pattern that positions over the edge of the first semiconductor chip. The one or more main surface bump electrodes are formed on one or more the upper layer wiring patterns to be in contact respectively with the one or more the upper layer wiring patterns. Remaining one or ones of the upper layer wiring patterns are free from being in contact with any one of the main surface bump electrodes.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Figure 9A:
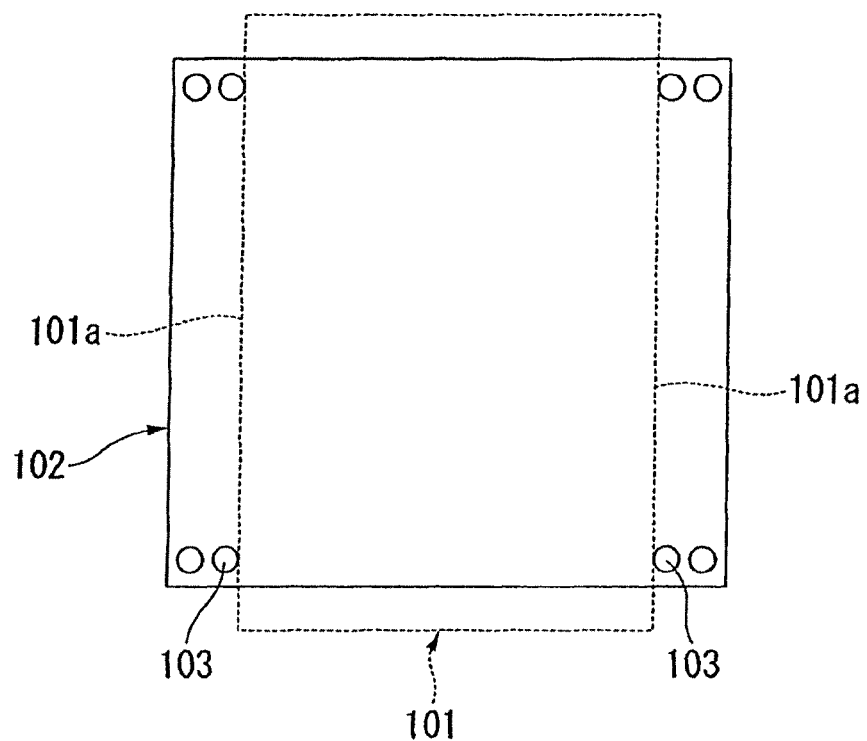
FIG. 9A is a plan view of a related semiconductor chip.
Figure 9B:
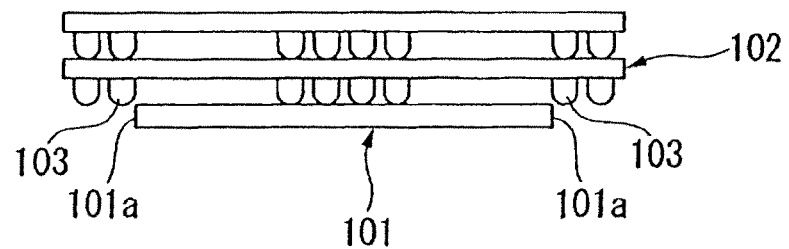
FIG. 9B is a sectional view of a stacked state of the related semiconductor chip.

Before describing of the present invention, the related art will be explained in detail with reference to FIGS. 9A and 9B in order to facilitate the understanding of the present invention.

A related semiconductor device comprises a first semiconductor chip 101 and two second semiconductor chips 102 each of which has a plane size larger than that of the first semiconductor chip 101. The first semiconductor chip 101 has edges 101a which extend parallel to each other in a predetermined direction. Each second semiconductor chip 102 comprises dummy bumps 103.

When the two second semiconductor chips 102 are stacked over the first semiconductor chip 101, there is a case where the dummy bumps 103 of a lower one of the second semiconductor chips 102 make contact with the edges 101a of the first semiconductor chip 101 that are disposed in the inside of the second semiconductor chips 102 on viewing a plane. As a result, it is feared that any crack occurs the first semiconductor chip 101. In FIG. 9A, the first semiconductor chip 101 is depicted at a broken line.

The invention will be now described herein with reference to illustrative embodiments. Drawings used in the following description are for describing configurations of exemplary embodiments of this invention, and therefore sizes, thicknesses, dimensions, or the like of respective parts illustrated may be different from relationships of actual sizes. In addition, materials or the like illustrated in the following description are one examples, this invention is not always limited thereto. Those skilled in the art will recognize that many alternative embodiments can be accomplished using the teachings of the present invention and that the invention is not limited to the embodiments illustrated for explanatory purposes.

First Exemplary Embodiment

Figure 1:
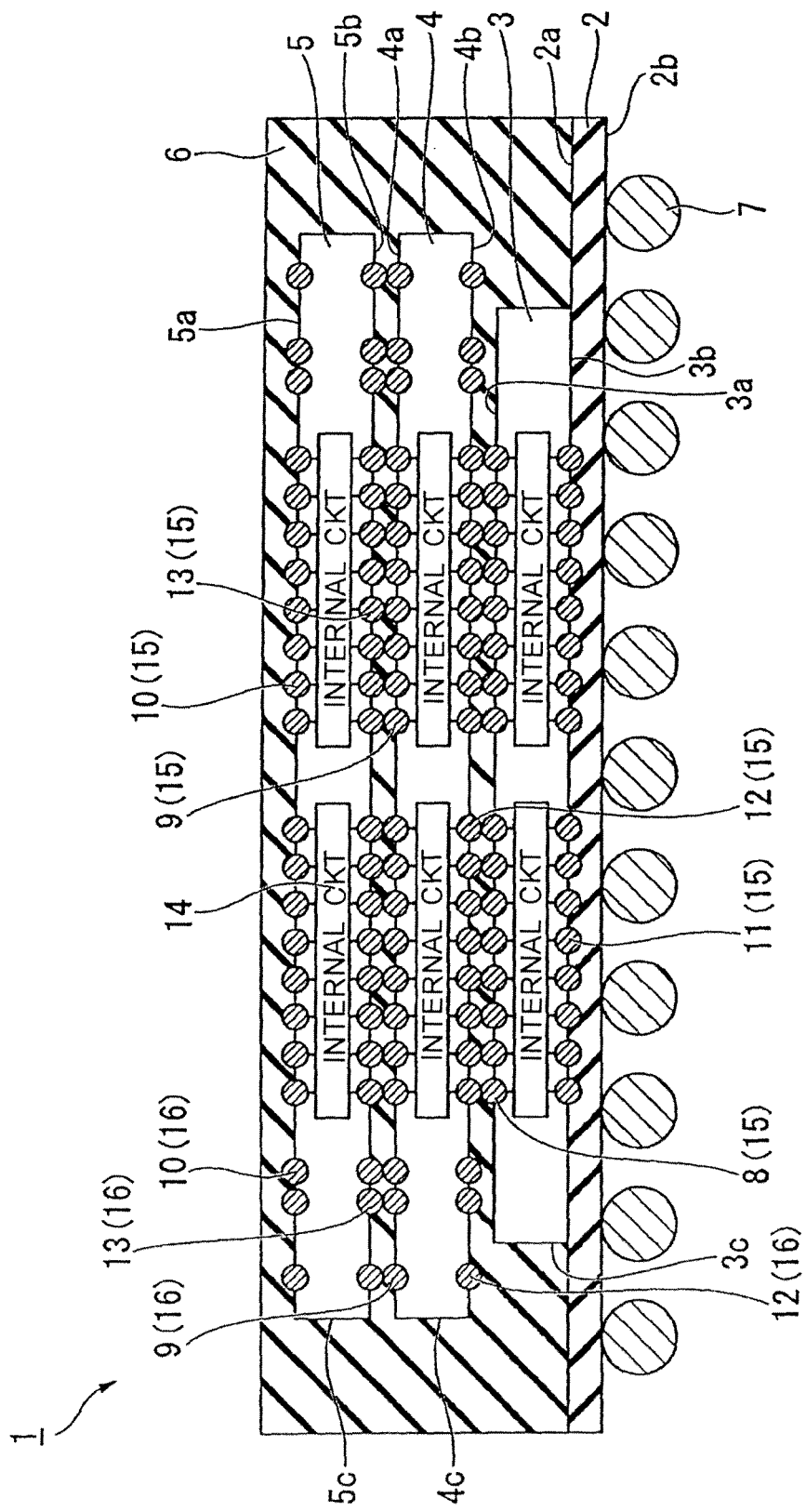
FIG. 1 is a sectional view of a semiconductor device according to a first exemplary embodiment of this invention.

As shown in FIG. 1, a semiconductor device 1 according to a first exemplary embodiment of this invention comprises a wiring substrate 2 having a main surface 2a and a rear surface 2b, a plurality of semiconductor chips 3, 4, and 5 which are stacked over the main surface 2a (one surface) of the wiring substrate 2, a sealing resin 6 which is formed on the main surface 2a of the wiring substrate 2 and which covers the respective semiconductor chips 3, 4, and 5, and external terminals 7 formed on the rear surface 2b (another surface) of the wiring substrate 2.

The wiring substrate 2 may comprise a circuit board, for example, an interposer or the like, comprising a resin in which a re-wiring layer is formed. Though the re-wiring layer formed in the wiring substrate 2, the semiconductor chip 3 stacked over the main surface 2a of the wiring substrate 2 and the external terminals 7 formed on the rear surface 2b of the wiring substrate 2 are electrically connected to each other.

The semiconductor chip 3, that is stacked on the wiring substrate 2, comprises a logic chip such as, for example, a system on chip (SOC). The semiconductor chip 4, that is stacked on the semiconductor chip 3, comprises a memory chip such as, for example, a dynamic random access memory (DRAM). he semiconductor chip 5, that is stacked on the semiconductor chip 4, similarly comprises a memory chip such as, for example, a dynamic random access memory (DRAM).

The semiconductor chip 4 and the semiconductor chip 5 are substantially equal in size to each other. Compared with the semiconductor chips 4 and 5, the semiconductor chip 3 has a smaller plane size. Specifically, on viewing cross section, the semiconductor chip 3 has a length in a width direction (a transversal direction in FIG. 1) which is shorter than that of each of the semiconductor chips 4 and 5.

The semiconductor chips 3, 4, and 5 respectively have main surfaces 3a, 4a, and 5a (one surfaces) on which a plurality of main surface bump electrodes 8, 9, and 10 are formed, respectively. The semiconductor chips 3, 4, and 5 respectively have rear surfaces 3b, 4b, and 5b (other surfaces) on which a plurality of rear surface bump electrodes 11, 12, and 13 are formed, respectively. Although FIG. 1 illustrates an example in which the respective semiconductor chips 3, 4, and 5 are implemented so that the main surfaces 3a, 4a, and 5a (the one surfaces) of the respective semiconductor chips 3, 4, and 5 are disposed to upper side while the rear surfaces 3b, 4b, and 5b (the other surfaces) of the respective semiconductor chips 3, 4, and 5 are disposed to lower side, namely, illustrates an example in which the respective semiconductor chips 3, 4, and 5 are implemented in a face-up type, this invention is not limited thereto. Specifically, the respective semiconductor chips 3, 4, and 5 may be implemented so that the rear surfaces 3b, 4b, and 5b (the other surfaces) of the respective semiconductor chips 3, 4, and 5 are disposed to upper side while the main surfaces 3a, 4a, and 5a of the respective semiconductor chips 3, 4, and 5 are disposed to lower side, namely, the respective semiconductor chips 3, 4, and 5 may be implemented in a flip-chip type.

Among the plurality of bump electrodes 8 to 13, the bump electrodes electrically connected to internal circuits 14 formed in the respective semiconductor chips 3, 4, and 5 serve as a part of penetration electrodes 15 (Through Silicon Via; TSV). That is, the bump electrodes electrically connected to the internal circuits 14 formed in the respective semiconductor chips 3, 4, and 5 act to convey, to the internal circuits, signals and power supply voltages supplied from the external of the semiconductor chips via the external terminals or the other semiconductor chips.

On the other hand, the bump electrodes, which are not electrically connected to the internal circuits 14, are dummy bump electrodes 16. The dummy bump electrodes 16 are so that edge portions 3c, 4c, and 5c of the respective semiconductor chips 3, 4, and 5 do not hit to each other in a case of stacking over the semiconductor chips 3, 4, and 5. In the embodiment, the dummy bump electrodes 16 are disposed so as to not overlap (hit) with the edge portions 3c of the semiconductor chip 3, this will be described in detail, below.

Although FIG. 1 illustrates an example where the dummy bump electrodes 16 are not electrically connected to the internal circuits, this invention is not limited thereto. It may be also possible to give still further stability to a power supply potential of the semiconductor device 1 by configuring so that the dummy bump electrodes are connected to power supply lines within the semiconductor chips. In either case, the dummy bump electrodes 16 have a function so that the edge portions 3c, 4c, and 5c of the respective semiconductor chips 3, 4, and 5 do not hit to each other in the case of stacking over the semiconductor chips 3, 4, and 5.

Although the description has been made about a case where the three semiconductor chips are stacked over the wiring substrate 2 in this exemplary embodiment, the number of the semiconductor chips is not limited thereto, and any number of the semiconductor chips may be stacked over the wring substrate 2. In addition, although the description has been made about a case where the semiconductor chip disposed to the wiring substrate 2 at the closest position comprises the logic chip in this exemplary embodiment, alternatively the semiconductor chip in question may comprise a memory chip and the logic chip may be disposed between the memory chips.

Now, the description will proceed to a configuration in a plane of the semiconductor chip 4.

Figure 2:
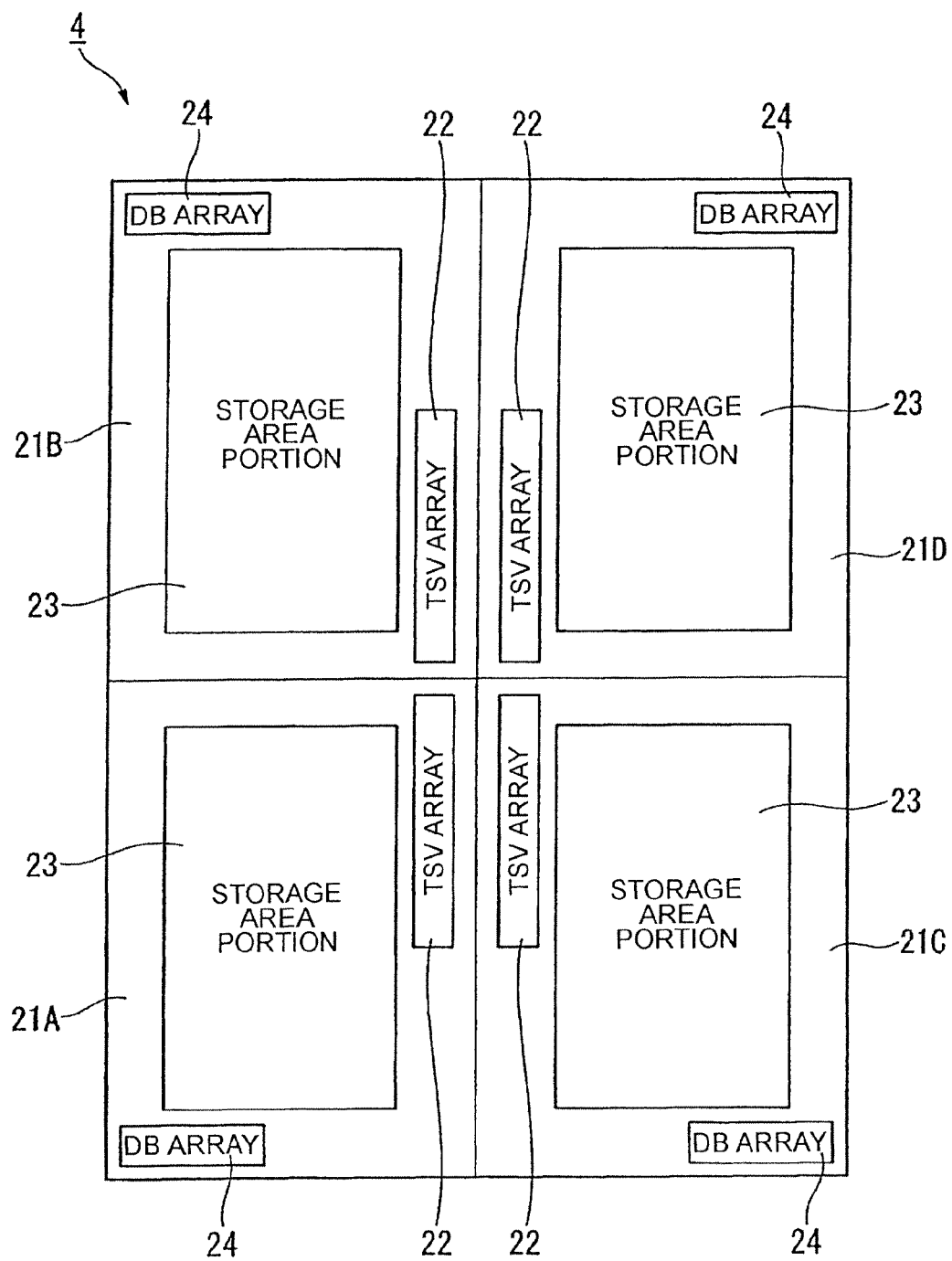
FIG. 2 is a plan vies of a semiconductor chip according to a first exemplary embodiment of this invention.

As illustrated in FIG. 2, the semiconductor chip 4 has a configuration of the so-called Wide-IO DRAM and has a configuration where two or more (four in FIG. 2) DRAMs are disposed on a semiconductor substrate. In the description below, the description will be made as regards such that the respective DRAMs are referred to as first through fourth channels 21A, 21B, 21C, and 21D, respectively, Each of the first through the fourth channels 21A to 21D comprises a penetration electrode array (TSV array) 22 in which the penetration electrodes 15 comprising a plurality of terminals for transmitting and receiving data, a command, and an address are disposed, and a storage area portion 23 including an internal control circuit and a memory cell array.

Each of the first through the fourth channels 21A to 21D can independently operate various operations such as a read operation, a write operation, a refresh operation, and so on under a control of a control circuit in the semiconductor chip 3 disposed at a lower side of the semiconductor chip 4.

The semiconductor chip 4 comprises two or more (four in FIG. 4) dummy bump array areas (DB arrays) 24 each of which includes a plurality of dummy bump electrodes 16.

Each of the dummy bump array areas 24 is provided for a corresponding one of the first through the fourth channels 21A to 21D. Each of the dummy bump array areas 24 is disposed between the storage area portion 23 of the corresponding one of channels 21A to 21D and a circumferential edge portion of the semiconductor chip 4. In other words, the internal control circuit and the memory cell array are not disposed between each dummy bump array area 24 and a peripheral portion of the semiconductor chip 4 that is closest thereto.

Although FIG. 2 illustrates a case where the dummy bump array areas 24 are disposed in proximity to respective four corners of the semiconductor chip 4 having a rectangular shape, this invention is not limited thereto.

For example, it is acceptable to configure so that the respective dummy bump areas 24 are disposed only in proximity to a pair of (two) corners in the four corners of the semiconductor chip 4 having the rectangular shape that are positioned in a diagonal line.

Although a chip configuration of the Wide-IO DRAM is illustrated as an example of the semiconductor chip 4, this invention is not limited thereto.

Now, the description will proceed to a cross-sectional configuration of the storage area portion 23 of the semiconductor chip 4.

Figure 3A:
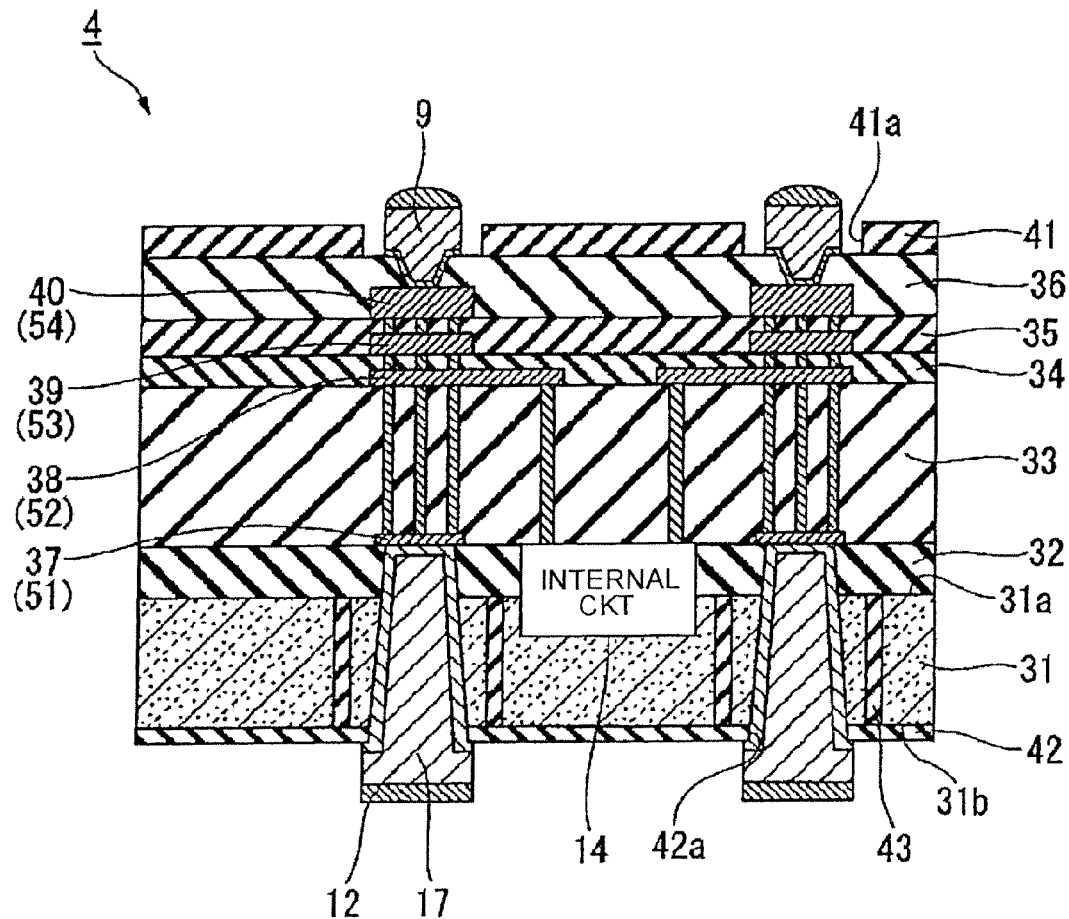
FIG. 3A is a sectional view of the semiconductor chip according to the first exemplary embodiment of this invention.
Figure 3B:
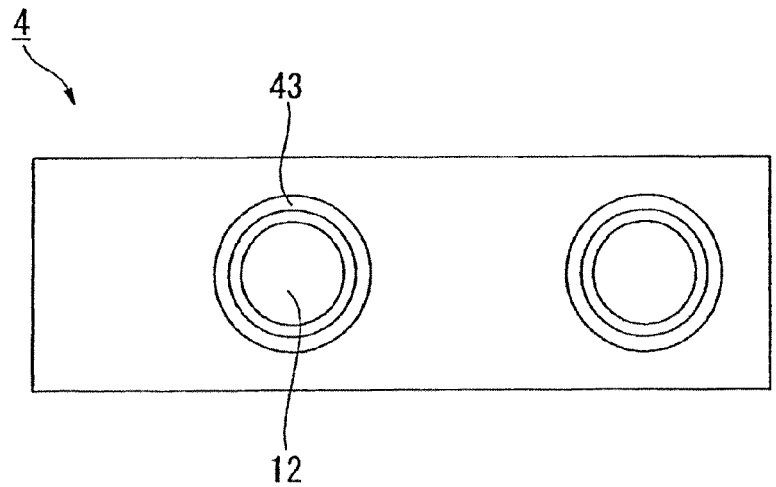
FIG. 3B is a bottom view of the semiconductor chip according to the first exemplary embodiment of this invention.

As shown in FIGS. 3A and 3B, the storage area portion 23 of the semiconductor chip 4 comprises the semiconductor substrate 31, first through fifth interlayer insulating films 32, 33, 34, 35, and 36, first through fourth wiring layers 37, 38, 39, and 40 constituting a multi-level wiring structure, a polyimide layer 41, a rear surface insulating layer 42, a plurality of main surface bump electrodes 9, a plurality of rear surface bump electrodes 12, a plurality of substrate through conductors 17, and insulating rings 43 formed in the semiconductor substrate 31.

The first interlayer insulating film 32 is provided on a main surface 31a (one surface) of the semiconductor substrate 31, the first wiring layer 37 having a predetermined pattern is formed on the first interlayer insulating film 32 and serves as lower layer wiring patterns 51. In addition, the second interlayer insulating film 33 is provided on the first interlayer insulating film 32 so as to cover the first wiring layer 37, and the second wiring layer 38 having a predetermined pattern is formed on the second interlayer insulating film 33.

Likewise, the third interlayer insulating film 34 is provided on the second interlayer insulating film 33 so as to cover the second wiring layer 38, the third wiring layer 39 is formed on the third interlayer insulating film 34, the fourth interlayer insulating film 35 is provided on the third interlayer insulating film 34 so as to cover the third wiring layer 39, the fourth wiring layer 40 is formed on the fourth interlayer insulating film 35, and the fifth interlayer insulating film 36 (the insulating film) is provided on the fourth interlayer insulating film 35 so as to cover the fourth wiring layer 40.

In addition, the second, the third, and the fourth wiring layers 38, 39, and 40 comprise layers including first intermediate layer wiring patterns 52, second intermediate layer wiring patterns 53, and upper layer wiring patterns 54, respectively.

In addition, the polyimide layer 41 is formed on the fifth interlayer insulating film 36. The polyimide layer 41 has opening portions 41a at positions corresponding to the upper layer wiring patterns 54. The rear surface insulating film 42 is formed on a rear surface 31b (another surface) of the semiconductor substrate 31 that is on the other side of the main surface 31a thereof. The rear surface insulating film 42 has opening portions 42a at positions corresponding to the lower layer wiring patterns 51.

The main surface bump electrodes 9 are formed in the opening portions 41a. The main surface bump electrodes 9 are electrically connected to the upper layer wiring patterns 54 by penetrating the fifth interlayer insulating film 36.

In addition, the substrate through conductors 17 and the rear surface bump electrodes 12 are formed in the opening portions 42a. The substrate through conductors 17 and the rear surface bump electrodes 12 are electrically connected to the lower layer wiring patterns 51 by penetrating the semiconductor substrate 31 and the first interlayer insulating film 32. The rear surface bump electrodes 12 are exposed from the rear surface 31b of the semiconductor substrate 31.

Within the semiconductor chip 4, the internal circuits 14 are mainly provided in the semiconductor substrate 31 and in the first interlayer insulating film 32. The internal circuits 14, the main surface bump electrodes 9, and the rear surface bump electrodes 12 are electrically connected to each other via various types of plugs, the first through the fourth wiring layers 37 to 40, and the substrate through conductors 17. In the manner which is described above, the bump electrodes 9, 12 and the substrate through conductors 17, which are formed in the storage area portion 23, are electrically connected to the internal circuits 14, and therefore serve as the penetration electrodes 15.

In addition, the insulating rings 43 are formed in the semiconductor substrate 31 so as to surround the substrate through conductors 17. The insulating rings 43 have a function for preventing currents flowing through the substrate through conductors 17 from flowing in the semiconductor substrate 31.

Now, the description will proceed to a cross-sectional configuration of the dummy bump array area 24 of the semiconductor chip 4.

Figure 4A:
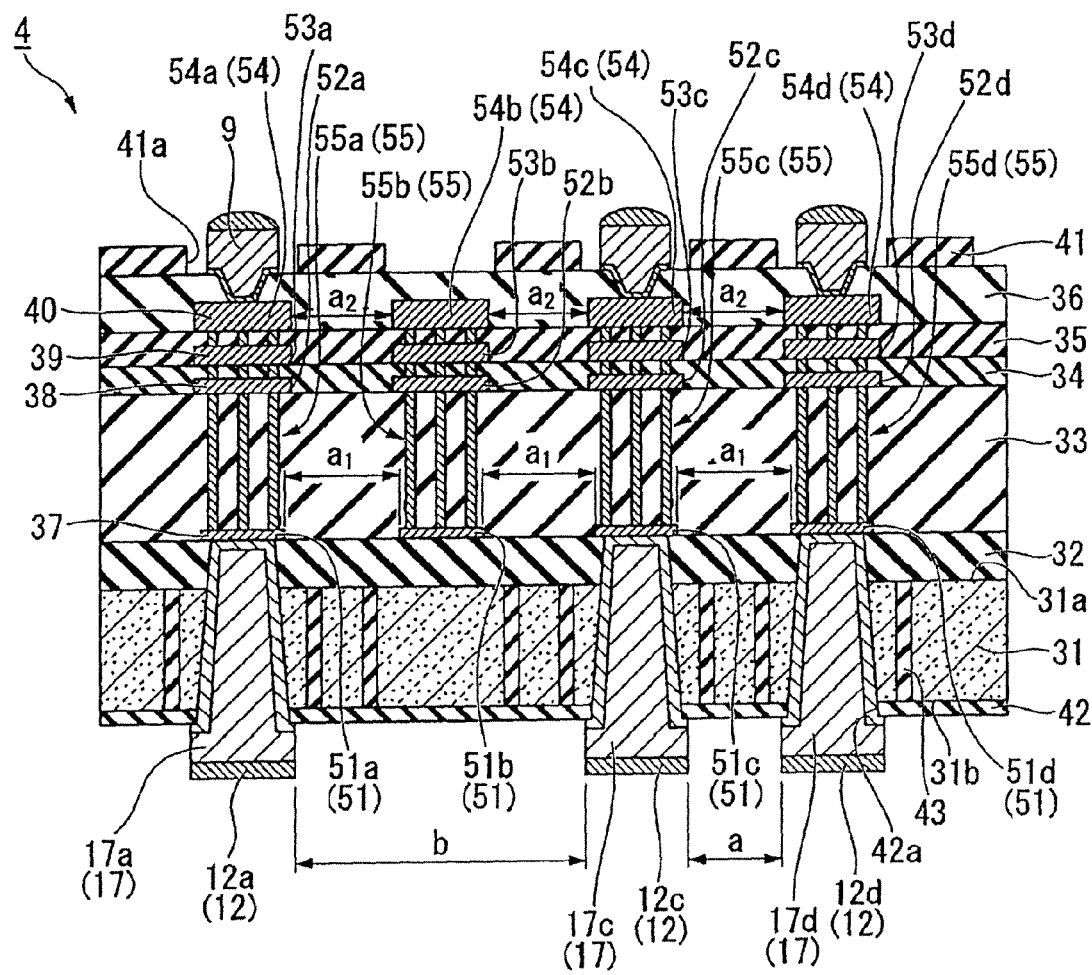
FIG. 4A is a sectional view of the semiconductor chip according to the first exemplary embodiment of this invention.
Figure 4B:
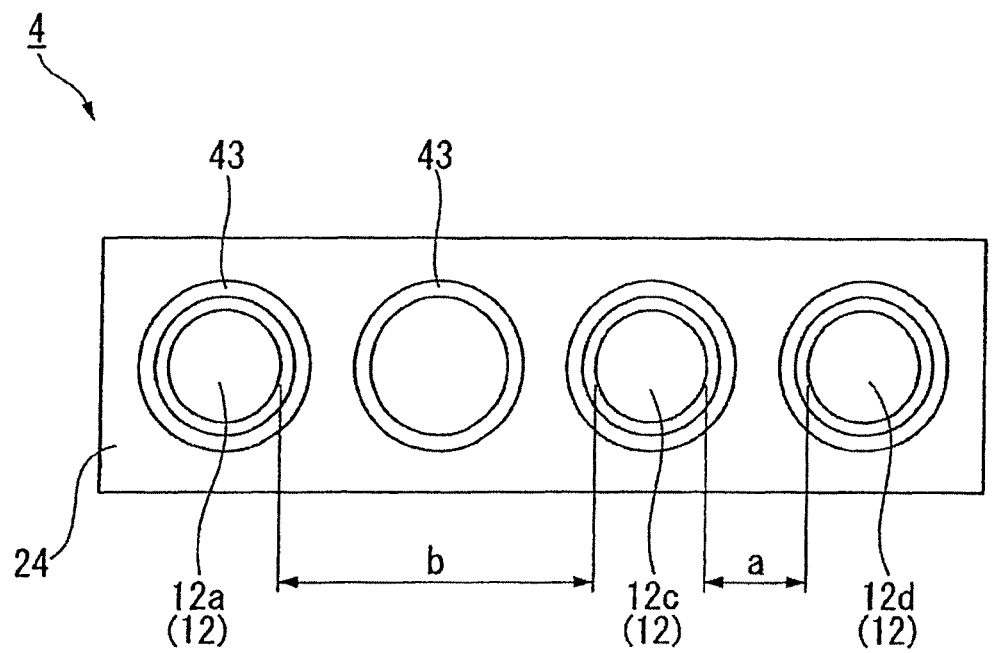
FIG. 4B is a bottom view of the semiconductor chip according to the first exemplary embodiment of this invention.

As shown in FIGS. 4A and 4B, the dummy bump array area 24 of the semiconductor chip 4 also comprises the semiconductor substrate 31, the first through the fifth interlayer insulating films 32 to 36, the first through the fourth wiring layers 37 to 40, the polyimide layer 41, the rear surface insulating layer 42, the plurality of main surface bump electrodes 9, the plurality of rear surface bump electrodes 12, the plurality of substrate through conductors 17, and the insulating rings 43 formed in the semiconductor substrate 31. The dummy bump array area 24 is basically similar in structure to the storage area portion 23. Hereafter, the description will be omitted as regards parts similar to the storage area portion 23 as appropriate.

In the dummy bump array area 24, the main surface bump electrodes 9, the rear surface bump electrodes 12, and the substrate through conductors 17 are not electrically connected to the internal circuits 14, and serve as the dumpy bump electrodes 16.

FIG. 4A illustrates an example where first through third main surface bump electrodes 9a, 9c, and 9d, first through third rear surface bump electrodes 12a, 12c, and 12d, and first through third substrate through conductors 17a, 17c, and 17d are formed. It will be assumed that a distance between the first rear surface bump electrode 12a and the second rear surface bump electrode 12c is represented by b while a distance between the second rear surface bump electrode 12c and the third rear surface bump electrode 12d is represented by a. Under the circumstances, the distance b is longer than the distance a and it is preferable that the distance b is longer than a distance obtained by adding a diameter of the rear surface bump electrode 12 to a length which is double in the distance a.

The illustrated dummy bump array area 24 of the semiconductor chip 4 comprises lower layer wiring patterns 51a, 51b, 51c, 51d, first intermediate layer wiring patterns 52a, 52b, 53c, 53d, second intermediate layer wiring patterns 53a, 53b, 53c, 53d, and upper layer wiring patterns 54a, 54b, 54c, 54d (a plurality of wiring patterns). Hereafter, a particular lower layer wiring pattern 51n (n=a, b, c, d), the first intermediate layer wiring pattern 52n (n=a, b, c, d) positioned thereabove, the second intermediate layer wiring pattern 53n (n=a, b, c, d) positioned thereabove, the upper layer wiring pattern 54n (n=a, b, c, d) positioned thereabove, and the plugs for electrically connecting them are collectively called a wiring pattern portion 55n (n=a, b, c, d). The description will be made on the assumption that the illustrated dummy bump array area 24 comprises four wiring pattern portions 55n (n=a, b, c, d).

The four lower layer wiring patterns 51a, 51b, 51c, 51d are spaced uniformly and are disposed so that a distance between adjacent two of the lower layer wiring patterns 51a, 51b, 51c, 51d is equal to $a_1$. Likewise, the four upper layer wiring patterns 54a, 54b, 54c, 54d are spaced uniformly and are disposed so that a distance between adjacent two of upper layer wiring patterns 54a, 54b, 54c, 54d is equal to $a_2$.

Herein, it is preferable that the distance a between the rear surface bump electrode 12c and the rear surface bump electrode 12d is shorter than the distance $a_1$ between the adjacent two of the lower layer wiring patterns 51a, 51b, 51c, 51d, namely, the rear surface bump electrode 12 is larger in size than the lower layer wiring patterns 51a, 51b, 51c, 51d.

Among the four wiring pattern portions 55a, 55b, 55c, 55d, the first, the third, and the fourth wiring pattern portions 55a, 55c, and 55d are connected to the first through the third main surface bump electrodes 9a, 9c, and 9d, respectively, and are connected to the first through the third rear surface bump electrodes 12a, 12c, and 12c, respectively.

On the other hand, the remaining one wiring pattern portion 55b (the second wiring pattern portion from the left in FIG. 4A) is not provided with the main surface bump electrode, with the substrate through conductor, and with the rear surface bump electrode.

Figure 4C:
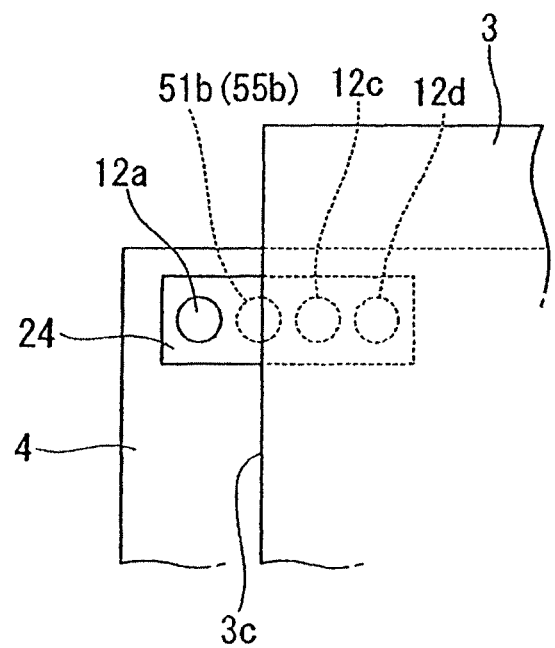
FIG. 4C is a plan view showing a stacked state of the semiconductor chip according to the first exemplary embodiment of this invention.

In addition, the second wiring pattern portion 55b is configured so as to be disposed over the edge 3c of the semiconductor chip 3 (see, FIG. 1) which is disposed at the lower side of the semiconductor chip 4. In other words, a second lower layer wiring pattern 51b (the second wiring portion 55b) is disposed at a position which overlaps to the edge 3c of the semiconductor chip 3 on viewing plane as shown in FIG. 4C.

In the manner which is described above, in this exemplary embodiment, the dummy bump array area 24 is configured to comprise at least one of the plurality of lower layer wiring patterns 51 that is not connected to the substrate through conductors, and to the rear surface bump electrodes.

As a result, upon stacking over the semiconductor chip 4, the lower layer wiring patterns 51, which are not connected to the rear surface bump electrodes, are disposed over the edge 3c of the semiconductor chip 3 disposed at the lower side thereof, it is therefore possible to prevent any crack from occurring in the edge portion 3c of the semiconductor chip 3 disposed at the lower side thereof.

Furthermore, in the manner which is described above, in this exemplary embodiment, the dummy bump array area 24 is configured to comprise at least one of the plurality of upper layer wiring patterns 54 that are not connected to the main surface bump electrodes.

As a result, upon stacking over the semiconductor chip 4 over the semiconductor chip 3 in the flip-chip type, it is possible to prevent any crack from occurring in the edge 3c of the semiconductor chip 3 disposed at the lower side thereof, it is therefore possible to prevent any crack from occurring in the edge 3c of the semiconductor chip 3 disposed at the lower side thereof.

In addition, in structure of the semiconductor chip 4 according to this exemplary embodiment, it is possible to design, in a designing stage, the semiconductor chip 4 so that the plurality of main surface bump electrodes 9 and the plurality of rear surface bump electrodes 12 are disposed at substantially equal intervals (a in FIG. 4A) and thereafter to do not provide with only the main surface bump electrodes 9, the rear surface bump electrodes 12, and the substrate through conductors 17 which are scheduled to provide at the positions overlapping to the edge 3c of the semiconductor chip 3 in plane with regard to a size of the semiconductor chip 3 stacked.

And, at this time, by stopping only formation of the main surface bump electrodes 9, the rear surface bump electrodes 12, and the substrate through conductors 17 while leaving the wiring pattern portions 55 without deleting the wiring pattern portions 55, it is possible to enjoy an effect so as to circumvent the need to redesign wiring layers included in the multi-level wiring structure and to change mask for manufacturing the wiring layers included in the multi-level wiring structure.

Second Exemplary Embodiment

Referring now to FIG. 5A, 5B, 5C, 6A, FIGS. 6B, and 6C, the description will proceed to a semiconductor device according to a second exemplary embodiment of this invention. The second exemplary embodiment is a modified example of the first exemplary embodiment and therefore the description will be omitted as regards to similar parts as appropriate. Also in the second exemplary embodiment, the description will proceed to the semiconductor device in which a semiconductor chip 4A is stacked over the semiconductor chip 3 as shown in FIG. 1.

The dummy bump array area 24 of the semiconductor chip 4A according to the second exemplary embodiment is different from that according to the first exemplary embodiment and is formed so that each of a lower layer wiring pattern 61, a first intermediate layer wiring pattern 62, a second intermediate layer wiring pattern 63, and an upper layer wiring pattern 64 is continuous (contiguous).

Other configurations are similar to those of the first exemplary embodiment. A distance between the first rear surface bump electrode 12a and the second rear surface bump electrode 12c is equal to b while a distance between the second surface bump electrode 12c and the third rear surface bump electrode 12d is equal to a. Specifically, the dummy bump array area 24 of the semiconductor chip 4A according to the second exemplary embodiment is configured so that only one of the rear surface bump electrodes 12 spaced uniformly (one depicted at a broken line at the second position from the left in FIG. 5A) is eliminated.

Figure 5A:
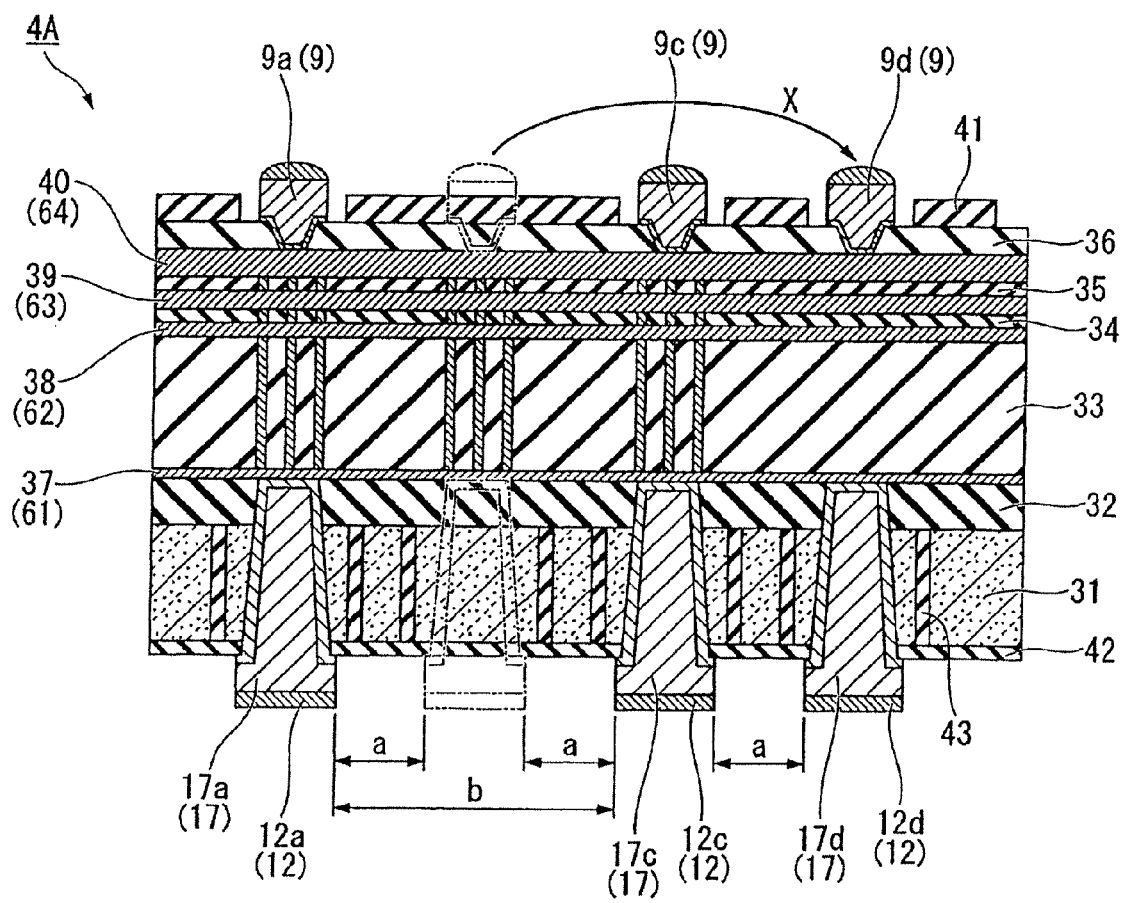
FIG. 5A is a sectional view of the semiconductor chip according to a second exemplary embodiment of this invention.
Figure 5B:
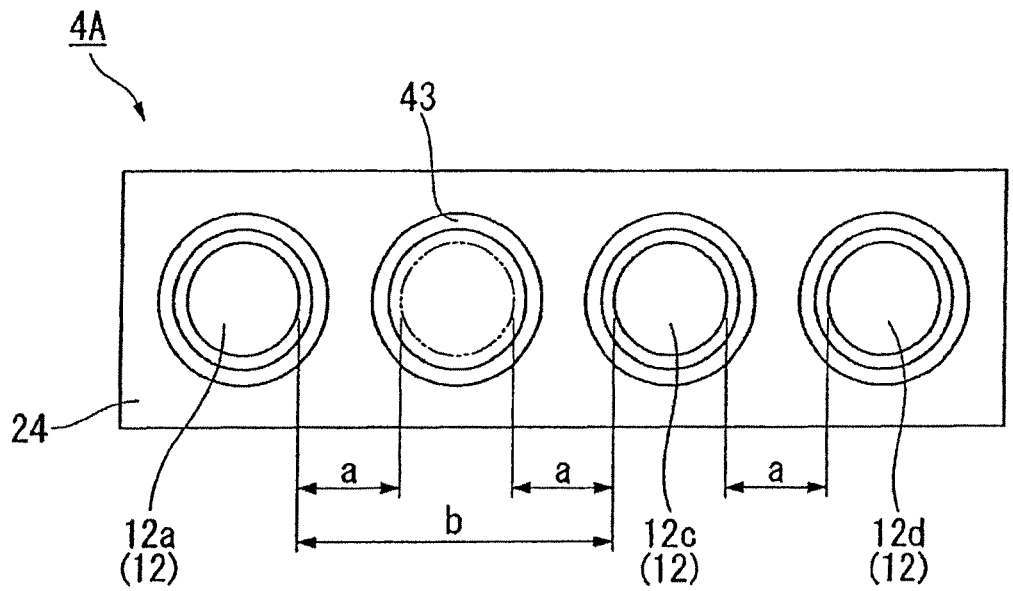
FIG. 5B is a bottom view of the semiconductor chip according to the second exemplary embodiment of this invention.
Figure 5C:
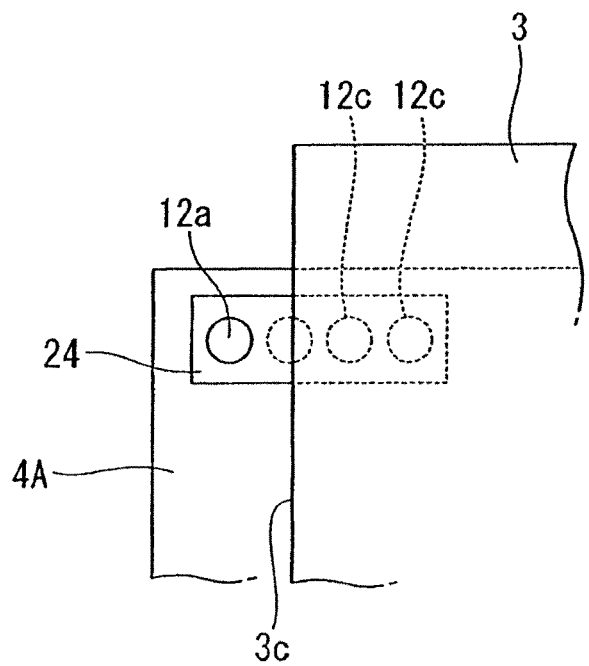
FIG. 5C is a plan view showing a stacked state of the semiconductor chip according to the second exemplary embodiment of this invention.

As shown in FIG. 5C, upon stacking the semiconductor chip 4A over the semiconductor chip 3, the semiconductor device according to the second exemplary embodiment is configured so that the rear surface bump electrode 12 is not provided to at a position which overlaps to the edge portion 3c of the semiconductor chip 3 on viewing plane.

In the manner which is similar to the first exemplary embodiment, in the second exemplary embodiment, it is possible to prevent any crack from occurring in the edge portion 3c of the semiconductor chip 3 disposed at the lower side because the bump electrodes are not connected above the edge portion 3c of the semiconductor chip 3 disposed to the lower side upon stacking over the semiconductor chip.

Inasmuch as the semiconductor device according to the second exemplary embodiment is configured so that the respective wiring patterns 61 to 64 become continuous wiring layers, it is possible to provide the main surface bump electrodes 9, the rear surface bump electrodes 12, and the substrate through conductors 17 at any positions in the dummy bump array area 24 without redesigning the wiring layers included in the multi-level wiring structure and without changing masks for manufacturing the multilayer wiring layer.

In the first exemplary embodiment, the description has been made about that it is possible to prevent any edge crack of the semiconductor chip 3 without redesigning the wiring layers included in the multi-level wiring structure by deleting only the main surface bump electrodes 9, the rear surface bump electrodes 12, and substrate through conductors 17 which are located at the position overlapping to the edge portion 3c of the semiconductor chip 3 in plane.

It is perfectly understandable that the number of the bump electrodes 9 and 12 decrease by deleting the bump electrodes 9 and 12, and it is therefore feared that the entire strength for supporting the semiconductor chip 5 stacked over the semiconductor chip 4 decreases.

Hence, the semiconductor device according to the second exemplary embodiment not only deletes the bump electrodes 9 and 12 located at the position overlapping to the edge portion 3c of the semiconductor chip 3 in plane but also can make alternative bump electrodes 9 and 12 and alternative substrate through conductors 17 at positions which do not overlap to the edge portion 3c of the semiconductor chip 3 instead of the deleted bump electrodes 9 and 12.

Figure 6A:
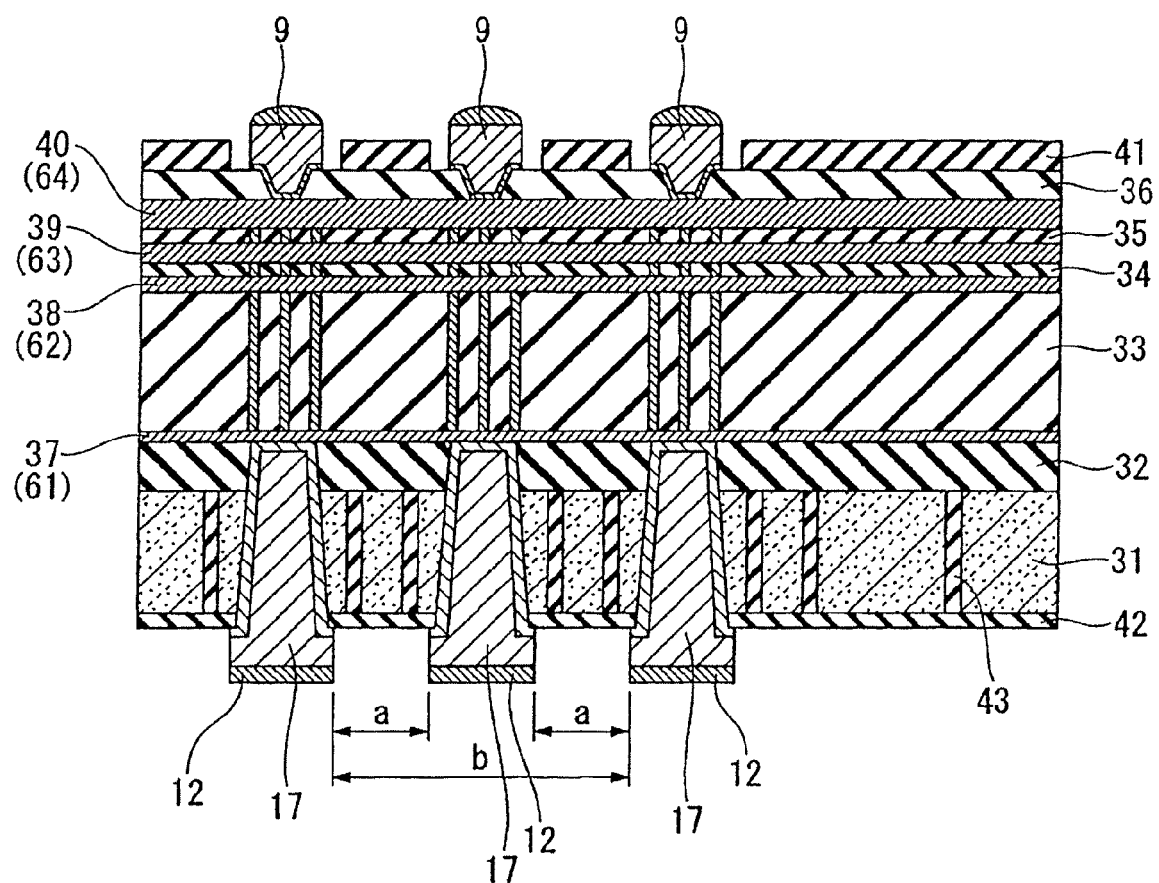
FIG. 6A is a sectional view of a design stage of the semiconductor chip according to a second exemplary embodiment of this invention.
Figure 6B:
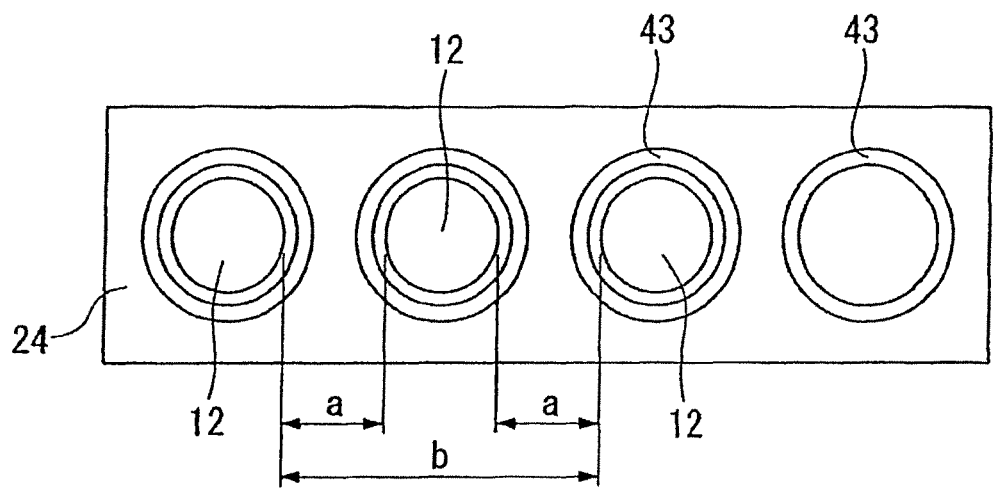
FIG. 6B is a bottom view of the design stage of the semiconductor chip according to the second exemplary embodiment of this invention.
Figure 6C:
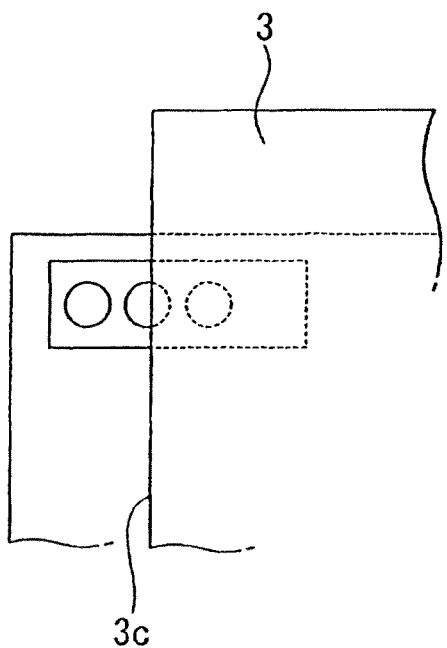
FIG. 6C is a plan view showing a stacked state of the design stage of the semiconductor chip according to the second exemplary embodiment of this invention.

More specifically, the semiconductor device first is designed in a design stage so that a plurality of bump electrodes are disposed at substantially equal intervals one another as shown in FIGS. 6A, 6B, and 6C. Subsequently, if the bump electrodes overlap to the edge portion 3c of the semiconductor chip 3 stacked in plane, only the overlapped bump electrodes 9 and 12 and overlapped substrate through conductors 17 may be moved to other positions as shown in an arrow X of FIG. 5A.

In other words, the semiconductor chip 4A is configured so as to easily move the bump electrodes 9 and 12 and the substrate through conductors 17 to any positions in the predetermined dummy bump array area 24.

For this reason, even if the edge portion 3c of the semiconductor chip 3 and the rear surface bump electrodes 12 of the semiconductor chip 4A overlap to each other, it is possible to prevent any crack of the semiconductor chip 3 without decreasing the entire strength for supporting the semiconductor chip 5.

Figure 7:
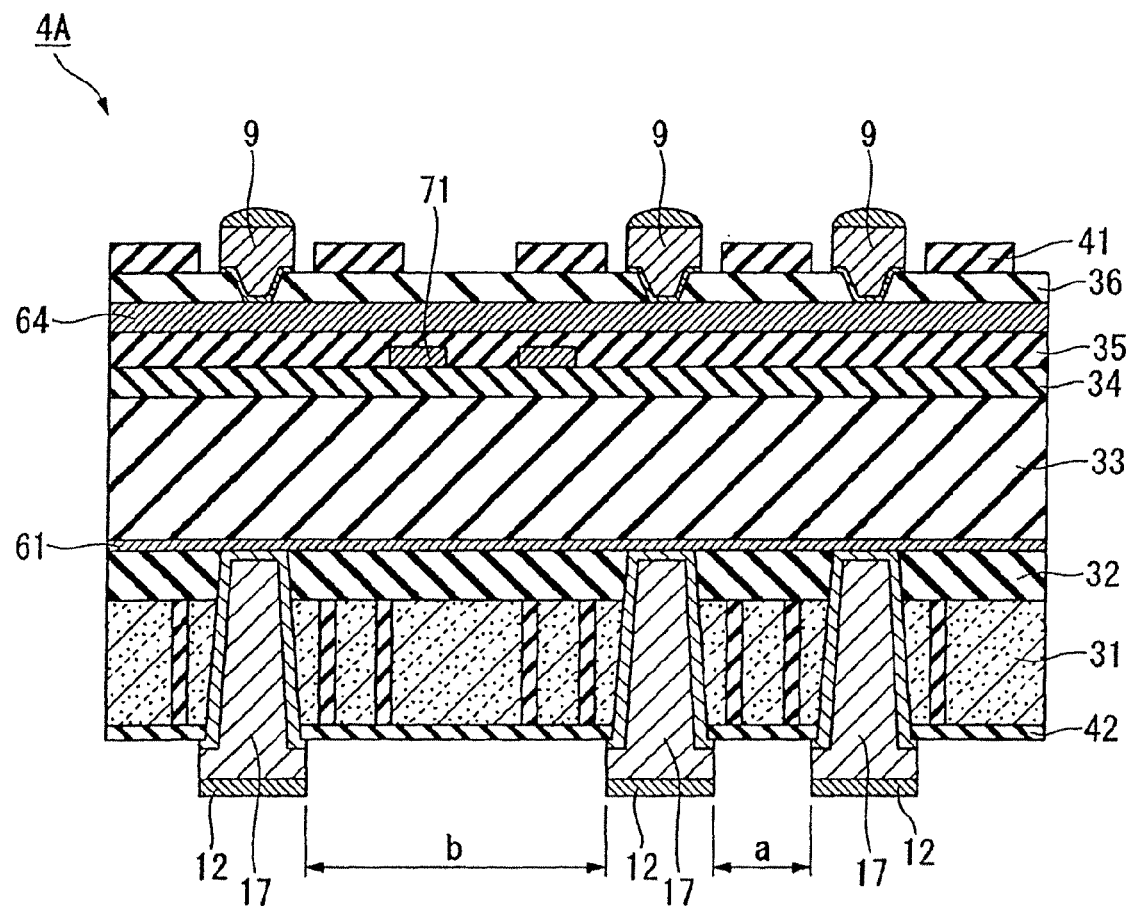
FIG. 7 is a sectional view of the semiconductor chip according to the second exemplary embodiment of this invention.

Although the description has been made about a case where any of the lower layer wiring pattern 61, the first intermediate layer wiring pattern 62, the second intermediate wiring pattern 63, and the upper layer wiring pattern 64 is formed so as to be continuous, this invention is not limited thereto. For example, the respective intermediate layer wiring patterns may not be formed or the respective intermediate layer wiring patterns may be formed as a particular pattern 71 as shown in FIG. 7.

This is because it is sufficient that there are only the lower layer wiring pattern 61 (on forming the substrate through conductors 17 and the rear surface bump electrodes 12) and the upper layer wiring pattern 64 (on forming the main surface bump electrodes 9) each of which serves as an edge stopper on forming in order to form the lower layer wiring pattern 61, the first intermediate layer wiring pattern 62, the second intermediate layer wiring pattern 63, and the upper layer wiring pattern 64, and there is no inconvenience even if the respective intermediate layer wiring patterns have any structure.

In addition, by deleting the respective intermediate layer wiring patterns, it is possible to use, as a region for arranging normal interconnection lines (power supply lines or signal lines), the second layer 38 and the third layer 39 among the multi-level wiring structure of the dummy bump array area 24.

Although the invention has been particularly shown and described with reference to exemplary embodiments thereof, the invention is not limited to these embodiments. It will be understood by those of ordinary skill in the art that various changes in form and details may be made therein without departing from the sprit and scope of the present invention as defined by the claims.

For example, this invention may be applicable to a semiconductor chip which composes a stacked semiconductor device and which comprises a dummy bump array (a plurality of dummy bump electrodes) for preventing chip edges from making contact with semiconductor chips stacked upper side and lower side and itself.

Figure 8A:
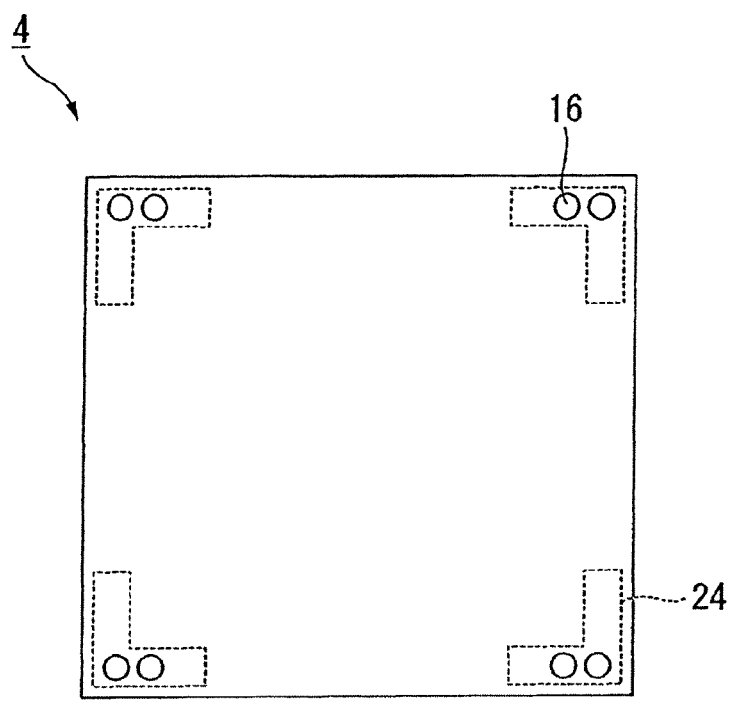
FIG. 8A is a plan view of a semiconductor chip according to an exemplary embodiment of this invention.
Figure 8B:
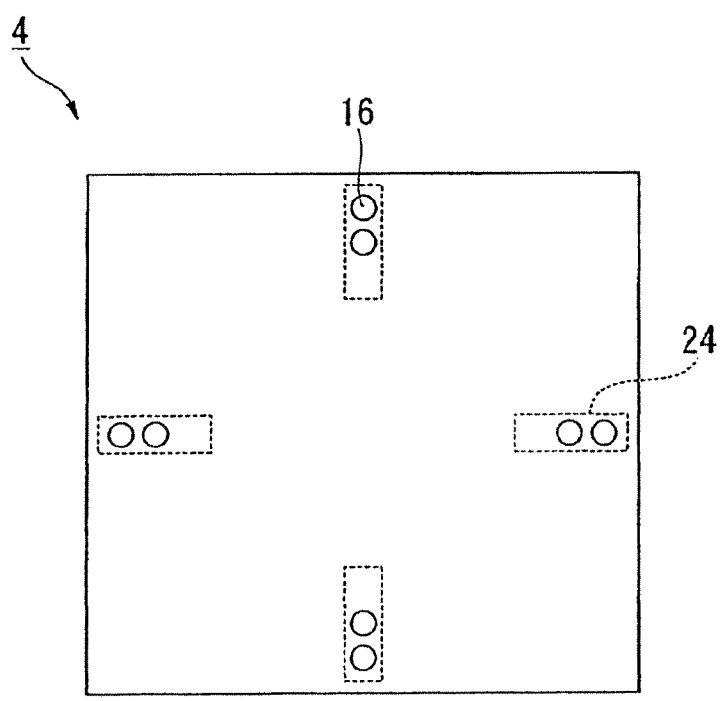
FIG. 8B is a plan view of a semiconductor chip according to an exemplary embodiment of this invention.

In addition, the dummy bump array areas 24 may be disposed in four corners of the rectangular semiconductor chip 4 so as to form an L-shape along the respective corners as shown in FIG. 8A and may be formed at areas extending toward a center from the middle of respective four sides of the rectangular semiconductor chip 4 as shown in FIG. 8B.

By configuring in such as a manner, it is possible to move not only in the longitudinal direction but also in the transversal direction on changing arrangement positions of the bump electrodes.

Furthermore, the semiconductor chip according to this invention may comprise the wiring pattern portions 55 formed in the dummy bump array areas 24 some of which are not connected to the main surface bump electrodes or the substrate through conductors, or the rear surface bump electrodes.

More specifically, when the semiconductor chip is stacked over in the flip-chip type, the semiconductor chip according to this invention may be configured so that the substrate through conductors and the rear surface bump electrodes are formed to the respective lower layer wiring patterns 51 of the plurality of wiring pattern portions 55 formed in the dummy bump array areas 24 while the main surface bump electrodes are not formed to at least one upper layer wiring pattern 54 of the plurality of wiring pattern portions 55.

Likewise, when the semiconductor chip is stacked over in the face-up type, the semiconductor chip according to this invention may be configured so that the main surface bump electrodes are formed to the respective upper layer wiring patterns 54 of the plurality of wiring pattern portions 55 formed in the dummy bump array areas 24 while the substrate through conductors and the rear surface bump electrodes are not formed to at least one lower layer wiring pattern 51 of the plurality of wiring pattern portions 55.

That is to say, in a case of implementing the semiconductor chip 4 on the semiconductor chip 3, among the plurality of main surface bump electrodes and the plurality of rear surface bump electrodes which form the plurality of dummy bump electrodes formed in the dummy bump array areas 24 of the semiconductor chip 4, by eliminating at least one of the main surface bump electrodes 9 or the rear surface bump electrodes 12 that is formed at a surface of the semiconductor chip 4 that is opposed to the semiconductor chip 3, namely, by eliminating the main surface bump electrodes 9 or the rear surface bump electrodes 12 which are positioned at edges of the semiconductor chip 3, it is possible to suppress any crack from occurring in the edges of the semiconductor chip 3.

INDUSTRIAL APPLICABILITY

This invention may be widely used in manufacturing industries for manufacturing semiconductor devices because this invention relates to the semiconductor device.

What is claimed is:
1. A device comprising:
 a first semiconductor chip including an edge defining a periphery of the first semiconductor chip; and
 a second semiconductor chip that is greater in size than the first semiconductor chip, the second semiconductor chip having TSVs (Through Silicon Vias) and being stacked over the first semiconductor chip so that the second semiconductor chip hangs over from the edge of the first semiconductor chip;
 the second semiconductor chip comprising:
  a main surface;
  a first plurality of upper layer wiring patterns positioning over the edge of the first semiconductor chip in top view;
  a second plurality of upper layer wiring patterns positioning off the edge of the first semiconductor chip in top view;
  a first insulating film formed on the main surface, the first insulating film covering over the first plurality of upper layer wiring patterns and the second plurality of upper layer wiring patterns, the first insulating film including one or more holes exposing a portion of a surface of the second plurality of upper layer wiring patterns, the one or more holes for being penetrated by a plurality of surface bump electrodes contacting with the second plurality of upper layer wiring patterns respectively.

2. The device as claimed in claim 1, wherein the second semiconductor chip further comprises a multi-level wiring structure including a first level wiring layer and a second level wiring layer formed over the first level wiring layer, and each of the upper layer wiring patterns is formed as the second level wiring layer.

3. The device as claimed in claim 2, wherein the second level wiring layer is an uppermost wiring layer of the multi-level wiring structure.

4. The device as claimed in claim 1, wherein the second semiconductor chip further comprises:
 a plurality of lower layer wiring patterns that are vertically arranged respectively with an associated one of the upper layer wiring patterns and including a second wiring patterns that is vertically arranged with the first wiring pattern,
 a substrate,
 a second insulating film formed on the substrate, and
 one or more substrate through conductors penetrating through the substrate and the second insulating film and being in contact respectively with one or more the lower layer wiring patterns, remaining one or ones of the lower wiring patterns being kept covered by the second insulating film, the remaining one or ones of the lower wiring patterns including the second wiring pattern.

5. The device as claimed in claim 4, wherein the second semiconductor chip further comprises a multi-level wiring structure including a first level wiring layer and a second level wiring layer formed over the first level wiring layer, each of the upper layer wiring patterns is formed as the second wiring layer, and each of the lower layer wiring patterns is formed as the first wiring layer.

6. The device as claimed in claim 5, wherein the second level wiring layer is an uppermost wiring layer of the multi-level wiring structure.

7. The device as claimed in claim 6, wherein the first level wiring layer is a lowermost wiring layer of the multi-level wiring structure.

8. The device as claimed in claim 5, wherein the first wiring layer is formed on the second insulating film.

9. The device as claimed in claim 4, wherein each of the one or more substrate through conductors is in contact with an associated one of the one or more the lower layer wiring patterns at one end thereof, and the second semiconductor chip further comprises a plurality of rear surface bump electrodes each formed on the other end of an associated one of the substrate through conductors.

10. The device as claimed in claim 1, wherein the second semiconductor chip further comprising a plurality of internal circuits, each of a part of the one or more the upper layer wiring patterns is electrically coupled to at least one of the internal circuits, the rest of the one or more the upper layer wiring patterns and the remaining one or ones of the upper layer wiring patterns are electrically disconnected from any one of the internal circuits.

11. The device as claimed in claim 1, wherein the second semiconductor chip includes an area that hangs over from the edge of the first semiconductor chip and at least one of the one or more the upper layer wiring patterns is disposed in the area.

12. The device as claimed in claim 1, wherein the first semiconductor chip includes a memory controller and the second semiconductor chip includes a memory circuit.

13. A device comprising:
a first semiconductor chip including an edge defining a periphery of the first semiconductor chip; and
a second semiconductor chip that is greater in size than the first semiconductor chip, the second semiconductor chip TSVs (Through Silicon Vias) and being stacked over the first semiconductor chip so that the second semiconductor chip hangs over from the edge of the first semiconductor chip;
the second semiconductor chip comprising:
a main surface;
a first plurality of upper layer wiring patterns positioning over the edge of the first semiconductor chip in top view;
a second plurality of upper layer wiring patterns positioning off the edge of the first semiconductor chip in top view; and
one or more main surface bump electrodes formed on one or more of the second plurality of upper layer wiring patterns, the one or more main surface bump electrodes respectively contact with the one or more of the second plurality of upper layer wiring patterns,
the first plurality of upper layer wiring patterns being free from being in contact with any main surface bump electrodes.

14. The device as claimed in claim 13, wherein the second semiconductor chip further comprises a multi-level wiring structure including a first level wiring layer and a second level wiring layer formed over the first level wiring layer, and each of the upper layer wiring patterns is formed as the second level wiring layer.

15. The device as claimed in claim 14, wherein the second level wiring layer is an uppermost wiring layer of the multi-level wiring structure.

16. The device as claimed in claim 13, wherein the second semiconductor chip further comprises:
a plurality of lower layer wiring patterns that are vertically arranged respectively with an associated one of the upper layer wiring patterns and including a second wiring pattern that is vertically arranged with the first wiring pattern,
a substrate, and
one or more substrate through conductors penetrating through the substrate and the second insulating film and being in contact respectively with one or more the lower layer wiring patterns, remaining one or ones of the lower wiring patterns being free from being in contact with any one of the substrate through conductors, the remaining one or ones of the lower wiring patterns including the second wiring pattern.

17. The device as claimed in claim 16, wherein the second semiconductor chip further comprises a multi-level wiring structure including a first level wiring layer and a second level wiring layer formed over the first level wiring layer, each of the upper layer wiring patterns is formed as the second wiring layer, and each of the lower wiring patterns is formed as the first wiring layer.

18. The device as claimed in claim 17, wherein the second level wiring layer is an uppermost wiring layer of the multi-level wiring structure.

19. The device as claimed in claim 18, wherein the first level wiring layer is a lowermost wiring layer of the multi-level wiring structure.

20. The device as claimed in claim 1, wherein the second semiconductor chip includes an area that hangs over from the edge of the first semiconductor chip and at least one of the one or more the upper layer wiring patterns is disposed in the area.

* * * * *